(12) United States Patent
Dittus et al.

(10) Patent No.: US 6,891,727 B2
(45) Date of Patent: May 10, 2005

(54) APPARATUS AND SYSTEM TO MOUNT A DEVICE TO A RACK

(75) Inventors: Karl Klaus Dittus, Durham, NC (US); Cynthia Michelle Grosser, Apex, NC (US); Dean Frederick Herring, Youngsville, NC (US); Brian Alan Trumbo, Apex, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 10/224,784

(22) Filed: Aug. 21, 2002

(65) Prior Publication Data

US 2004/0037046 A1 Feb. 26, 2004

(51) Int. Cl.[7] .................................................. H05K 5/00
(52) U.S. Cl. ...................... 361/724; 361/727; 211/26; 312/334.5
(58) Field of Search ................................ 361/724, 727, 361/683–685, 756, 825; 211/26, 187, 190; 312/334.41, 334.5, 334.7, 334.8, 350, 223.1, 265.1, 265.4, 319.1; 311/103, 175; 248/298.1, 243; 403/377; 384/24, 22, 23

(56) References Cited

U.S. PATENT DOCUMENTS

| | | | |
|---|---|---|---|
| 3,042,221 A | | 8/1960 | Rasmussen |
| 3,561,608 A | | 2/1971 | Weider ........................ 211/176 |
| 5,571,256 A | | 11/1996 | Good et al. .................... 211/26 |
| 5,791,498 A | * | 8/1998 | Mills ............................ 211/26 |
| 5,833,337 A | * | 11/1998 | Kofstad ................... 312/334.5 |
| 6,021,909 A | | 2/2000 | Tang et al. .................... 211/26 |
| 6,230,903 B1 | * | 5/2001 | Abbott ......................... 211/26 |
| 6,293,507 B1 | | 9/2001 | Gorniak ...................... 248/243 |
| 6,442,030 B1 | * | 8/2002 | Mammoser et al. ........ 361/727 |
| 6,578,939 B1 | * | 6/2003 | Mayer ..................... 312/334.5 |
| 6,601,713 B2 | * | 8/2003 | Kaminski ..................... 211/26 |
| 6,615,992 B1 | * | 9/2003 | Lauchner et al. ............. 211/26 |
| 6,626,300 B2 | * | 9/2003 | Kaminski et al. ............. 211/26 |

OTHER PUBLICATIONS

U.S. patent application publication US 2002/0093795 A1, by Gough et al. filed Jan. 16, 2002.*
U.S. patent application publication US 2003/0107309 A1 by Lauchner, filed Dec. 6, 2001.*
U.S. patent application publication US 2001/0040203 A1 by Brock et al, filed Mar. 19, 2001.*

* cited by examiner

Primary Examiner—Michael Datskousky
(74) Attorney, Agent, or Firm—Lally & Lally, LLP (57) ABSTRACT

A system and apparatus to mount devices to a rack is disclosed. Embodiments may comprise mounting hardware configured to adaptively accommodate attachment features of a rack to mount devices such as servers to the rack. A device attachment member may couple with the device, and some of these device attachment members may comprise a bent portion to facilitate coupling the device to vertical members of a rack. Many device attachment members may have in place of or in addition to the bent portion, a slide attachment member and rack attachment slidably coupled with the device attachment member to provide tool-less attachment of the device to the rack via pins. These rack attachments may also adaptively accommodate attachment features such as round openings, square openings, and/or threaded openings of a vertical member of the rack and may advantageously provide a threaded member to secure the device attachment member to vertical members.

18 Claims, 6 Drawing Sheets

APPARATUS AND SYSTEM TO MOUNT A DEVICE TO A RACK

FIELD OF INVENTION

The present invention is in the field of rack-mounted devices. More particularly, the present invention provides an apparatus and system to mount a device to racks having different attachment features.

BACKGROUND

Computer and data storage devices are housed in standardized equipment enclosures. These enclosures may have an outer, aesthetically pleasing housing that is supported by an inner rack. The rack is a substantially rectilinear metal frame including several vertical columns each provided with a plurality of mounting and alignment openings or holes that permit mounting various devices in the rack.

Rails that mount to the vertical members or columns of the rack support the devices or components. The rails are screwed or bolted to the rack and the devices are placed on a pair or set of rails. In conventional systems, the openings of the rack are spaced in Electronic Industries Association units (EIA-U). The EIA-U is a standardized unit of length equal to 44.45 millimeters. Although standardized placement of the openings improves interchangeability between rails of enclosure systems, the openings in the rack may be round, square, or threaded so the design and selection of rails for the rack is dependent upon the type of openings in the columns or vertical members of the rack.

As a result, the consumer must determine which rails will attach properly to the rack within an enclosure, adding to the complexity of planning and ordering devices and enclosed systems. Further, recent efforts to maximize space utility within racks has increased the variety of rails manufactured, increasing the number of mounting kits that must be stocked by the manufacturer and increasing the burden on the consumer to plan for and purchase enclosure systems and rails.

SUMMARY OF THE INVENTION

The problems identified above are in large part addressed by a system and apparatus to mount devices such as servers to a rack having mounting hardware to adapt to attachment features of a rack. A device attachment member may couple with the device, and some of these device attachment members may comprise a bent portion to facilitate coupling the device to vertical members of a rack. Many device attachment members may have in place of or in addition to the bent portion, a slide attachment member and rack attachment slidably coupled with the device attachment member to provide tool-less attachment of the device to the rack via pins. Further, the rack attachment may advantageously provide a threaded member to secure the device attachment member to vertical members such as vertical columns of the rack. These rack attachments may be adaptable to accommodate attachment features such as round openings, square openings, and/or threaded openings of a vertical member of the rack. Other implementations may provide a slide to facilitate pulling the device out of the rack without dismounting the device.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

A system and apparatus to mount devices to a rack is disclosed. Embodiments may comprise mounting hardware to adapt to attachment features of a rack to mount devices such as servers to a rack. A device attachment member may couple with the device, and some of these device attachment members may comprise a bent portion to facilitate coupling the device to vertical members of a rack. Many device attachment members may have in place of or in addition to the bent portion, a slide attachment member and rack attachment slidably coupled with the device attachment member to provide tool-less attachment of the device to the rack via pins. These rack attachments also be adaptable to accommodate attachment features such as round openings, square openings, and/or threaded openings of a vertical member of the rack and may advantageously provide a threaded member to secure the device attachment member to vertical members.

Figure 1:
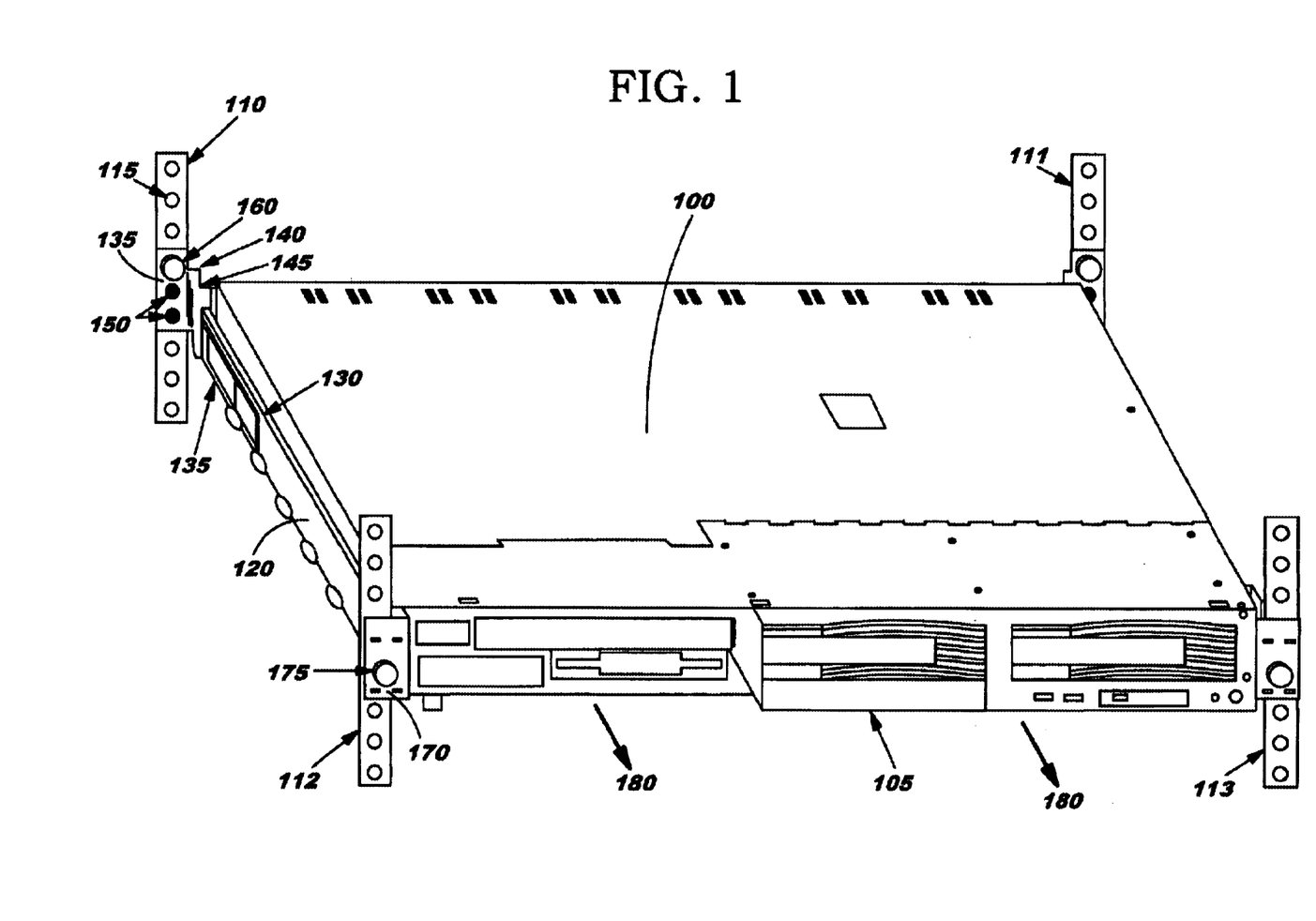
FIG. 1 depicts an embodiment of a system comprising a server mounted in a rack having mounting hardware to adapt to attachment features of the rack.

Turning now to the drawings, FIG. 1 depicts an embodiment of a system comprising a server 100 mounted in a rack having mounting hardware to adapt to attachment features 110, 111, 112, 113, and 115 of the rack. Mounting hardware may couple the left and right side of server 100 to vertical members 110, 111, 112, and 113 of the rack, wherein edge 105 is the front of server 100. The mounting hardware may comprise device attachment member 120, and hardware to couple device attachment member 120 with vertical members 110 and 112 as illustrated by slide attachment member 130 and rack attachment 135.

Device attachment member 120 may comprise a horizontal member to couple with server 100. In several embodiments, device attachment member 120 may further comprise slide 170. Slide 170 may couple with server 100 and may be slidably coupled with device attachment member 120 to advantageously facilitate pulling server 100 out or partially out of the rack while server 100 remains mounted to vertical members 110, 111, 112, and 113. For instance, server 100 may be serviced by actuating member 175, such as a thumb screw or catch, to free slide 170 and by pulling server 100 in direction 180. Further, the bent portion of the slide 170 may prevent server 100 from moving in a direction opposite of direction 180.

Figure 1A:
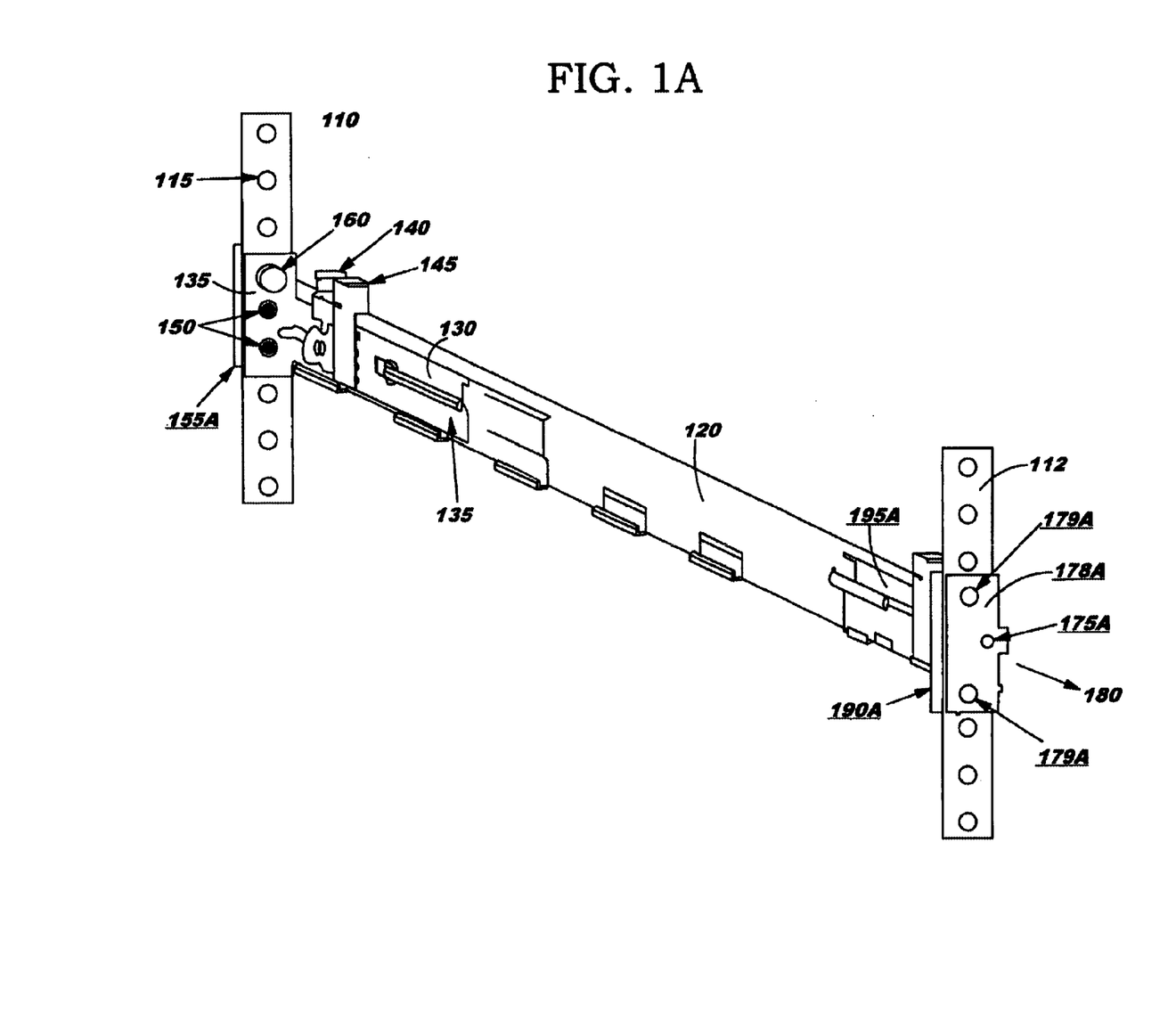
FIG. 1A depicts an embodiment of an apparatus to mount a server to a rack as viewed from the outside of the rack.

Referring now to FIG. 1A, there is shown a more detailed view of the mounting hardware on the left side of server 100 as depicted in FIG. 1 but without server 100. Device attachment member 120 may comprise a bend portion having openings 175A and 179A. Opening 175A may adaptively accommodate coupling with server 100 or slide 170 (shown in FIG. 1) to restrict movement of slide 170 in direction 180 via member 175 (shown in FIG. 1). Further embodiments may not comprise a slide such as slide 170 and many of these embodiments may be dismounted from vertical members 110, 111, 112, and 113 if server 100 is to be removed from the rack for servicing.

In the present embodiment, openings 179A may adaptively accommodate pins of rack attachment 190A to further secure slide attachment member 120 to vertical member 112. In other embodiments, such as embodiments wherein vertical member 112 comprises threaded attachment features like threaded openings, threaded members such as bolts or screws may couple slide attachment member 120 with vertical member 112 via openings 179A. In such embodiments, fastening threaded members to vertical member 112 via openings 179A may push pins of rack attachment 190A away from vertical member 112, sliding slide attachment member 195A toward or beyond the trigger position corresponding to slide attachment 195A. The trigger position of slide attachment 195A may be a position to facilitate alignment of pins of rack attachment 190A with openings of vertical member 112. In still further embodiments, the pins of rack attachment 190A may be removed to provide threaded openings, nuts, and/or traveling nuts in rack attachment 190A and threaded members may couple rack attachment 190A with vertical member 112. For instance, the threaded openings or nuts may couple rack attachment 190A to vertical member 112 or may accommodate a fixed-size gap between rack attachment 190A and vertical member 112. Traveling nuts, on the other hand, may accommodate a variable-size gap between rack attachment 190A and vertical member 112 to sandwich vertical member 112 between the traveling nuts and bent portion 178A.

Slide attachment member 130 may couple with device attachment member 120 to allow rack attachment 135 to slide along part of the length of device attachment member 120. In some embodiments, slide attachment member 130 may couple with device attachment member 120 via spring 132.

Rack attachment 135 may couple vertical member 110 with device attachment member 120 via slide attachment member 130. Rack attachment 135 may comprise a plate to align pins 150 and securing bolt 160 with attachment features such as opening 115 in vertical member 110. When the attachment features comprise non-threaded openings of vertical member 110, slide attachment member 130 may slide toward vertical member 110 to insert pins 150 into the openings. In other embodiments, pins 150 may be inserted into threaded openings of vertical member 110.

In some embodiments, rack attachment 135 may comprise lever 140 and button 145. Lever 140 may comprise a member attached to slide attachment member 130 to assist in sliding rack attachment 135 and button 145 may comprise a member to lock slide attachment member 130 in one or more positions. In the present embodiment, spring 132 may be substantially unloaded when pins 150 are inserted in the openings of vertical member 110 and may compress when lever 140 is pulled away from vertical member 110 in direction 180. Button 145 may hold slide attachment member 130 in a position such as a trigger position.

When pressure is applied to button 145, spring 132 may facilitate insertion of pins 150 into the openings of vertical member 110. In other embodiments, spring 132 may facilitate removal of pins 150 from the openings. After pins 150 are slid into the openings, pins 150 may provide vertical support to server 100 via slide attachment member 130 and device attachment member 120. Securing member 160, such as a bolt or a traveling nut, may then fasten rack attachment 135 to vertical member 110 via an opening of openings 179A.

In several of these embodiments, server 100 may be coupled with vertical member 110 without tools. In further embodiments, lever 140 and button 145 may comprise a single member adapted to push and/or pull rack attachment 135 and release slide attachment member 130 from a hold position.

In alternative embodiments, the vertical member 110 may be positioned horizontally or at an angle and still take advantage of embodiments of the invention. In further embodiments, components or devices other than a server 100 may be coupled with vertical member 110. For example, printers, routers, hubs, switches, gateways, video players and/or recorders, and other components or devices may be mounted in a rack with embodiments of the present invention.

Figure 2:
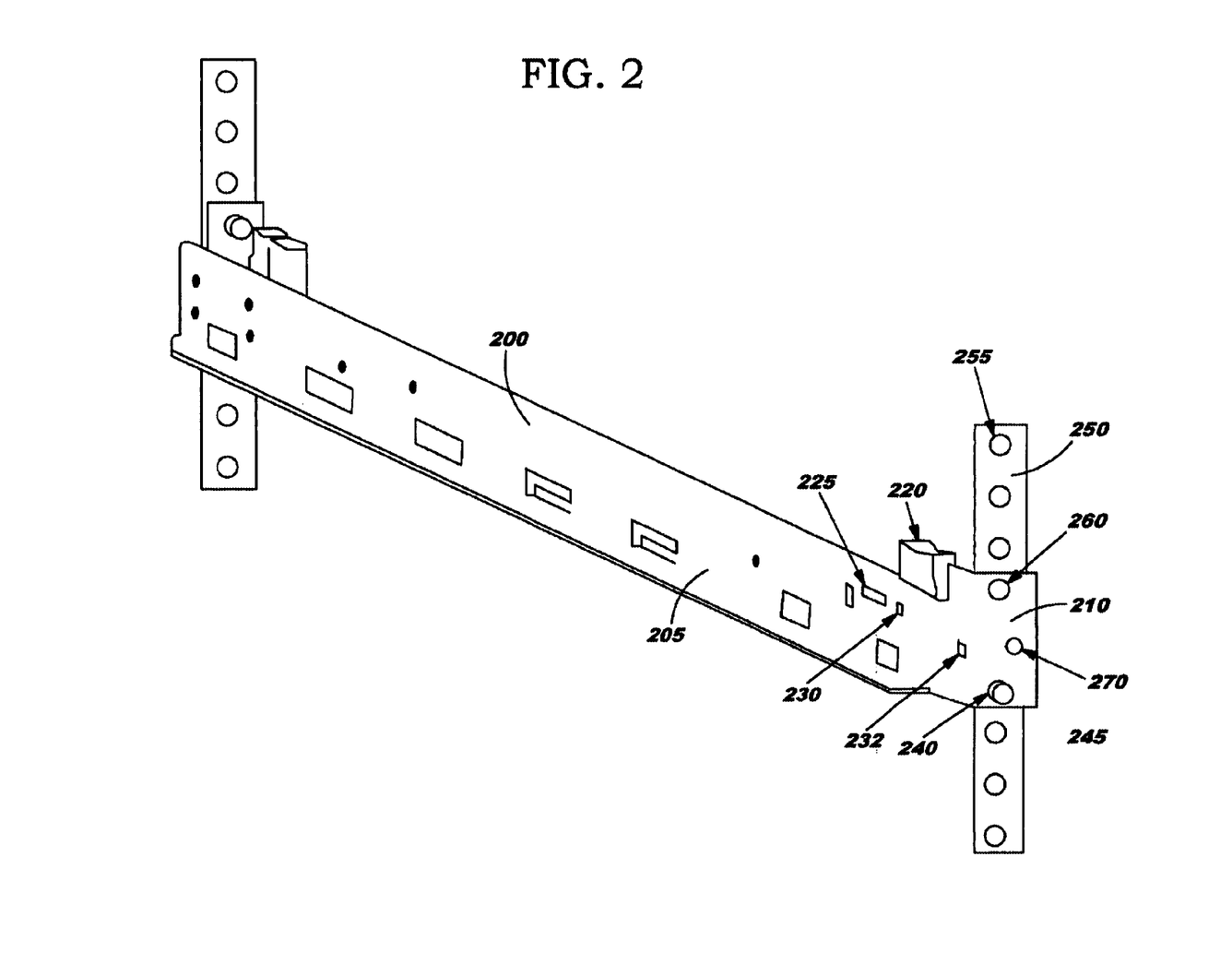
FIG. 2 depicts an embodiment of a device attachment member to mount a server to a rack as viewed from the inside (server side) of the rack.

Referring now to FIG. 2, there is shown an embodiment of a device attachment member 200 to mount a server to a rack as viewed from the inside (server side) of the rack. The device attachment member 200 may comprise shelf 205 to couple with a server or the like and bent portion 210. Bent portion 210 may extend around vertical member 250 on the inside of the rack to avoid increasing the width of the rack or interfering with enclosure attachments and have openings such as openings 240, 260, and 270. The present embodiment depicts a device attachment member for a 1U server and bent portion 210 comprises openings such as openings 240 and 260 aligned with openings of vertical member 250 such as opening 255. Opening 270 may provide for attachment of the front of a server. In other embodiments, for servers of more than 1U, bent portion 210 may cover more than three openings.

Openings 240 and 260 in bent portion 210 may align with openings of vertical member 250 to adapt to attachment characteristics of vertical member 250. In particular, opening 240 may receive a threaded member such as a bolt of a screw to fasten device attachment member to vertical member 250 when the openings of vertical member 250 are threaded. In several of these embodiments, opening 240 may not be threaded. On the other hand, opening 240 may receive a pin 245 coupled with rack attachment (not shown) and slide attachment member 220 when vertical member 250 comprises unthreaded openings like opening 250. For instance, slide attachment member 220 may be coupled with device attachment member 200 to slide toward and away from vertical member 250 parallel to the length of device attachment member 200. Rack attachment (not shown) may comprise a plate attached to the end of slide attachment member 220 nearest vertical member 250 and may comprise openings aligned with openings of vertical member 250. In several of these embodiments, pins such as pin 245 may couple with the plate via the openings of the rack attachment and the pins may allow the mounting hardware to adapt to non-threaded openings of vertical member 250. The pins may be pushed into and/or through the openings of vertical member 250 to fasten device attachment member 200 to the rack associated with vertical member 250.

In further embodiments, the rack attachment may comprise a securing bolt aligned with opening 260 of bent portion 210 to secure rack attachment to vertical member 250 when pins such as pin 245 are implemented to couple vertical member 210 to device attachment member 200. In such embodiments, opening 260 may comprise a threaded opening, and in some of these embodiments, a securing bolt may be attached to bent portion 210 without the use of tools. The securing bolt may bolt to a nut of slide attachment member 220 via opening 260 and an opening of vertical member 250.

Device attachment member 200 may further comprise opening 225 to hold slide attachment 220 in a position. In particular, opening 225 may be located at a trigger position for slide attachment member 220. For example, when slide attachment member is slid back to the trigger position, an extension of a button of slide attachment member may protrude through opening 225 to hold slide attachment member at the trigger position. The trigger position may facilitate positioning device attachment member 200 between attachment features of the rack such as vertical member 250. In the trigger position, pin 245 of the rack attachment may be positioned near opening 240. After pin 245 is substantially aligned with the desired opening of vertical member 250, the button of slide attachment member 220 may be pressed to back the extension out of opening 225. Slide attachment member 220 may then slide with respect to device attachment member 200 to insert pin 245 through opening 240.

In the present embodiment, opening 240 may comprise an elongated opening, larger than the extension of the button, to allow slide attachment member 220 to slide away from vertical member 250. For instance, in embodiments wherein the bent portion 210 of device attachment member 200 may be fastened to vertical member 250 via a threaded member, the threaded member may be fastened through opening 240. While fastening the threaded member through opening 240, the threaded member may contact pin 245 and push pin 245 away from vertical member, sliding slide attachment member away from vertical member 250, and sliding the extension along opening 240.

Further embodiments may comprise opening 230 and tab 232 to provide guides to position vertical member 250 between slide attachment member 220 and bent portion 210. After pin 245 is inserted through opening 240, vertical member 250 is clamped between bent portion 210 and slide attachment member 220.

In several embodiments, pin 245 may comprise a first portion having a first cross-section to couple with a first type of opening in vertical member 250 and a second portion having a larger cross-sectional area than the first portion to couple with a different type of opening in vertical member 250. In further embodiments, pin 245 may comprise a spring-loaded ball bearing or an opening for a cotter pin to provide resistance to removal of pin 245 from opening 240.

Figure 3:
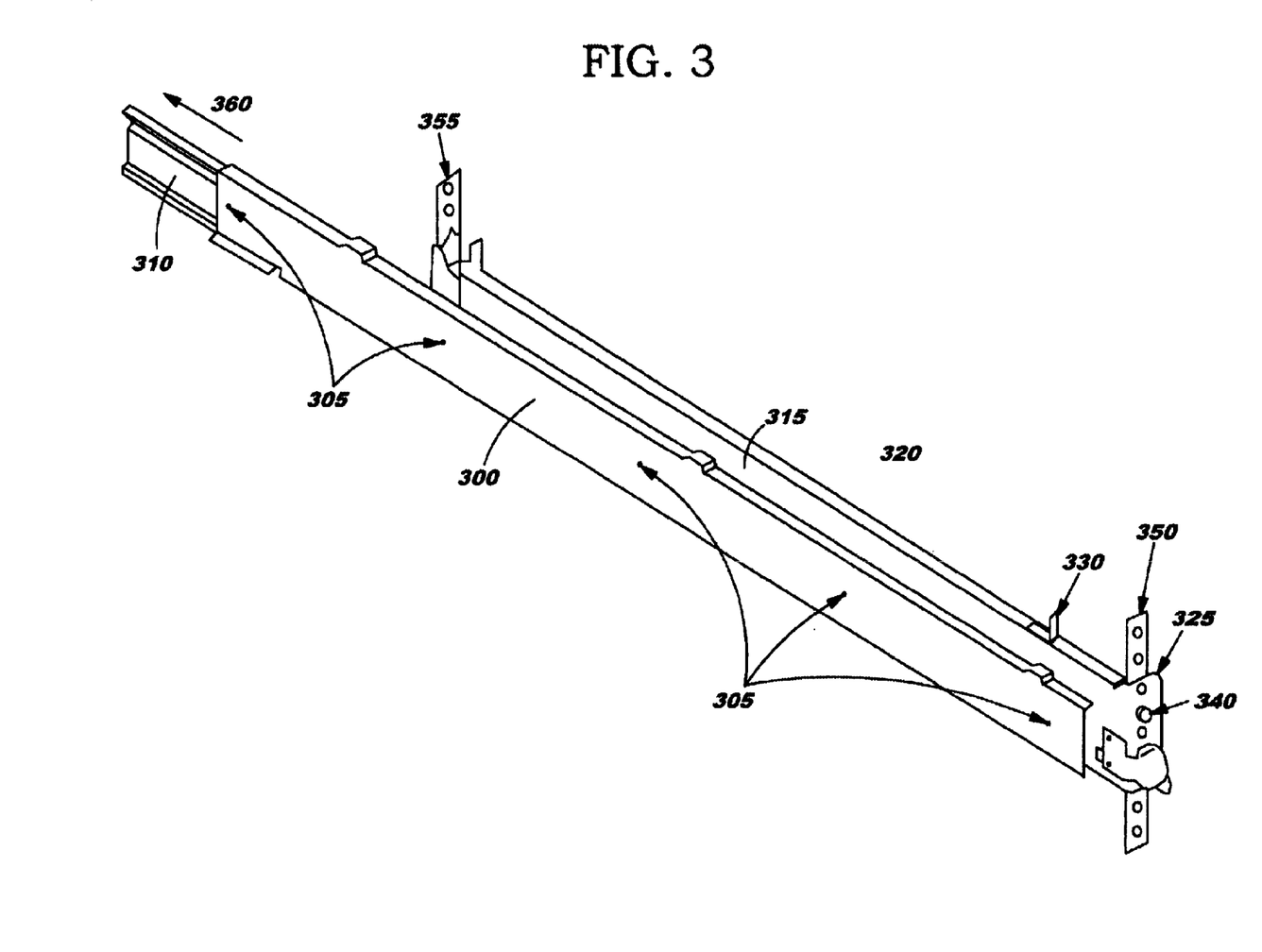
FIG. 3 depicts an embodiment of device attachment member to mount a device to a rack having a telescoping slide to facilitate moving a mounted device out of the rack.

Referring now to FIG. 3, there is shown an embodiment of device attachment member 320 to mount a server to a rack having a telescoping slide to facilitate moving a mounted server out of the rack. Device attachment member 320 may comprise first slide 300, second slide 310, fixed member 315, lever 330, bent portion 325, and pin 340. First slide 300 may couple with a server via openings 305. The openings may accommodate screws, bolts, or the like to secure the server to first slide 300.

Second slide 310 may slidably couple with first slide 300 to facilitate sliding the server along the length of second slide 310 and provide vertical support for the server. Fixed member 315 may slidably couple second slide 310 with vertical members 350 to provide vertical support for second slide 310. For example, the server may be pulled in direction 360. First slide 300 may extend out a distance from the end of second slide 310. After reaching that distance, a coupling of first slide 300 and/or second slide 310 may attach first slide 300 to second slide 310. If the server is pulled further in direction 360, second slide 310 may slide along the length of fixed member 315 until a coupling between second slide 310 and fixed member 315 provides resistance to pulling the server further in direction 360.

Fixed member may comprise lever 330, bent portion 325, and pin 340 to attach fixed member 315 to vertical members 350 of the rack. For instance, pin 340 may be aligned with an opening of bent portion 325. After the opening of bent portion 325 is aligned with an opening of vertical member 350, lever 330 may be actuated to insert pin 340 into the opening of vertical member 350 and, in some embodiments, through the opening of bent portion 325. In several of these embodiments, more than one pin may be inserted into openings of vertical member 350.

The present embodiment illustrates a lever at each end of fixed member 320, however, embodiments may comprise a single lever to insert pins through vertical members 350 and 355. For example, one or more compressed springs coupled with the pins such as pin 340 may decompress at the actuation of lever 330, inserting the pins into vertical members 350 and 355.

Figure 4:
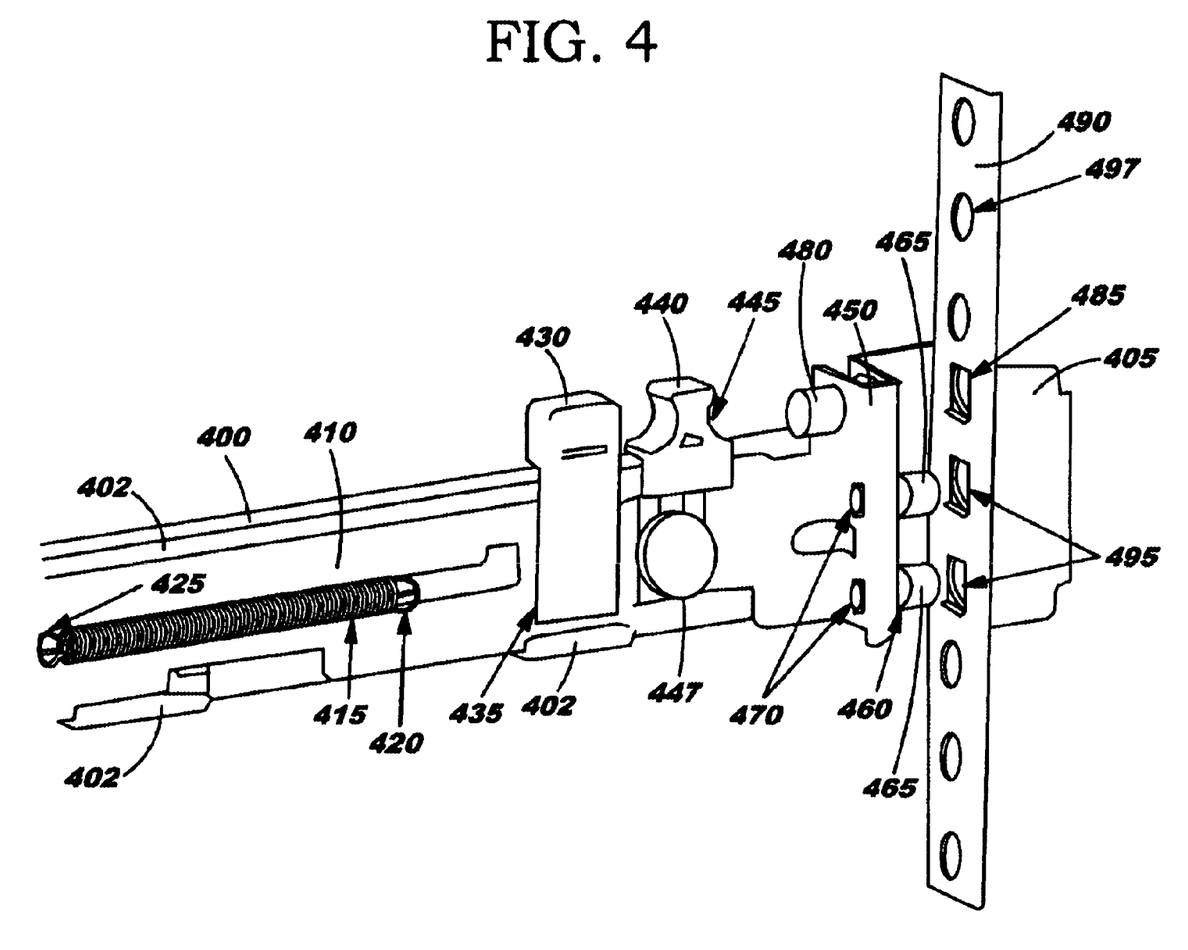
FIG. 4 depicts an embodiment of an apparatus to mount a device to a vertical member of a rack as viewed from the outside of the rack.

Referring now to FIG. 4, there is shown an embodiment of an apparatus to mount a device to an attachment feature of a rack as viewed from the outside of the rack. The apparatus may provide universal mounting hardware for the device, configured to adaptively accommodate an attachment feature of the rack such as vertical member 490 having openings like square openings, round openings, or threaded openings. The apparatus may comprise device attachment member 400, slide attachment member 410, and rack attachment 450. Device attachment member 400 may couple a server or the like with vertical member 490 via openings of vertical member 490 such as openings 485, 495, and 497. In several embodiments, device attachment member 400 may comprise bent portion 405 having openings aligned with openings 485 and 495 of vertical member 490 to couple rack attachment 450 with vertical member 490.

Slide attachment member 410 may provide a mechanism to move rack attachment 450 toward and away from vertical member 490. Slide attachment member may comprise a member slidably coupled with device attachment member 410 to slide along an axis of device attachment member 410, coupled via spring 415 and guides 402. In particular, spring 415 may couple slide attachment member at tab 425 with device attachment member 400 at tab 420. In some embodiments, spring 415 may be loaded or compressed by pulling lever 440 at curved portion 445 away from vertical member 490 to the trigger position, the position illustrated in FIG. 4. In these embodiments, pressing button 440 toward the outside of the rack may withdraw an extension of button 430 from an opening of device attachment member 400, allowing spring 415 to decompress and insert pins 470 into openings 495.

Button 430 may couple with slide attachment member 410 at base 435 to facilitate pressing button 430 toward the outside of the rack. Lever 440 may couple with slide attachment member 410 via rivet 447 or the like.

Rack attachment 450 may comprise a bent portion of slide attachment member 410 configured to adaptively accommodate an attachment feature of a rack such as vertical member 490, to couple a device with the rack. For instance, rack attachment 450 may adaptively accommodate round openings like opening 497, square openings like opening 485, or threaded openings. In several of these embodiments, rack attachment 450 may advantageously adapt to facilitate fastening to such attachment features without tools.

In the present embodiment, rack attachment 450 comprises pins 470 to adapt to couple with both square openings and round openings. Pins 470 may comprise cylindrical portion 465 to couple with round openings such as opening 497 of vertical member 490 and a second cylindrical portion 460 having a larger cross-sectional area than cylindrical portion 465, coupled between the cylindrical portion 465 and a lip of rack attachment 450, to couple with rectangular openings like openings 495 of vertical member 490. For example, when slide attachment member 410 slides into the set position, the second cylindrical portions 460 of pins 470 may be inserted into the square openings 495 of vertical member 490. On the other hand, in other embodiments wherein openings 495 may be round, cylindrical portions 465 may be inserted into openings 495 and cylindrical portions 460 may rest against vertical member 490. In further embodiments, second cylindrical portions 460 may inserted into larger round openings or be replaced with a portion having symmetrical, rectangular cross-section or other cross-section adapted to couple with an opening.

Rack attachment 450 may further comprise threaded member 480 to fasten rack attachment 450 with the vertical member 490 via an opening in rack attachment 450 aligned with opening 485. In particular, threaded member 480 may fasten to a threaded opening in bent portion 405 of device attachment member 400. In other embodiments, threaded member 480 may comprise a nut such as a traveling nut or a bolt having threads about an internal circumference to accommodate a gap between slide attachment member 450 and vertical member 490. A securing bolt may then be inserted through bent portion 405 and opening 485 to clamp slide attachment member 450 against vertical member 490 via the threaded member 480. Such a securing method may be advantageous in applications wherein the rack may be installed in locations zoned for earthquakes or the like, or during shipment.

In alternative embodiments, pins 470 may be removable to expose threaded openings to facilitate securing of rack attachment 450 to vertical member 490 via threaded openings of vertical member 490.

Figure 4A:
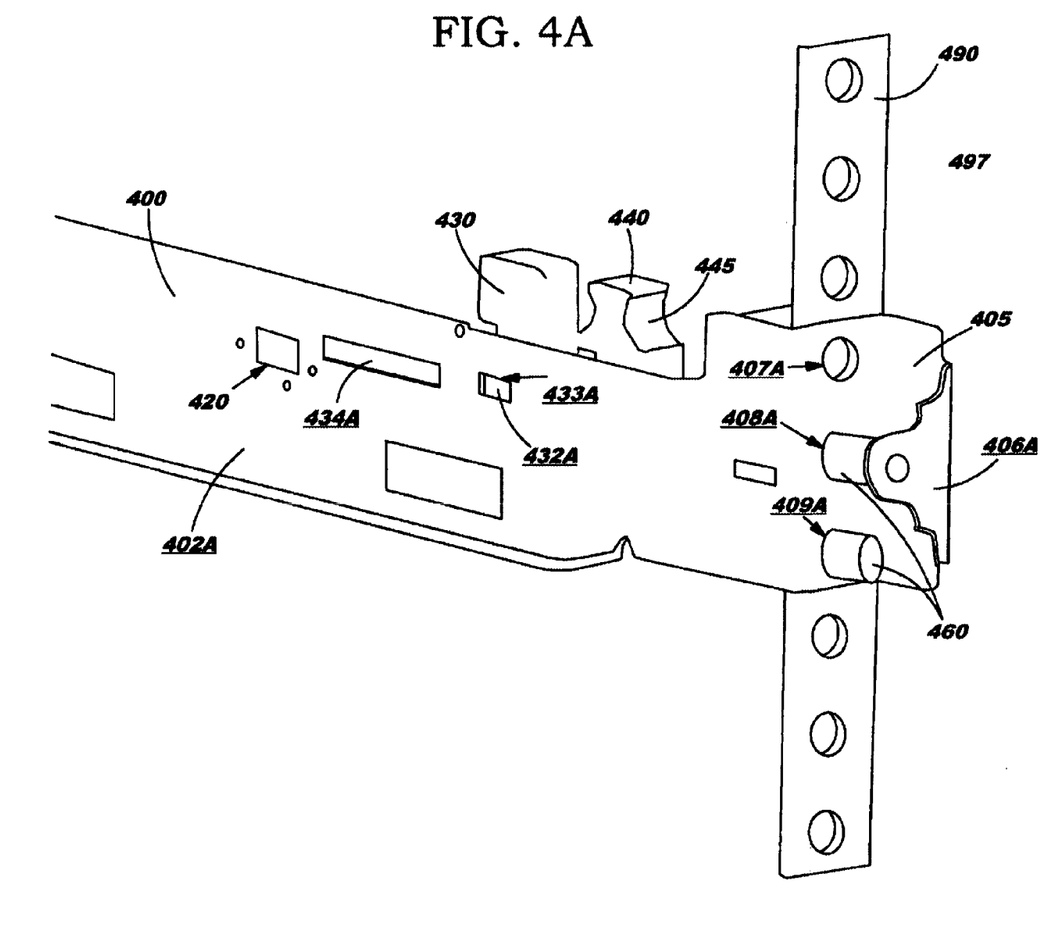
FIG. 4A depicts an embodiment of the apparatus of FIG. 4 as viewed from the inside (device side) of the rack.

Referring now to FIG. 4A, there is shown an embodiment of the apparatus of FIG. 4 to mount a device to a vertical member of a rack as viewed from the inside (server side) of the rack. Device attachment member 400 may comprise a fixed member having a shelf 402A, openings 433A and 434A and a bent portion 405.

Shelf 402A may provide attachment with the device. In some embodiments, shelf 402A may further provide for attachment and support with a slide to couple with the device, allowing the device to slide at least partially out of the rack while remaining mounted to the rack. In other embodiments, depending upon the dimensions of the rack and the device, there may be insufficient space to fit a slide between device attachment member 400 and the device.

Openings 433A and 434A may provide for holding slide 410 as shown in FIG. 4, in a set position and trigger position respectively with extension 432A of button 430. In other embodiments, other arrangements may facilitate holding slide attachment member in a position such as tabs of device attachment member 400 extending toward button 430.

Bent portion 405 may comprise openings 406A, 407A, 408A, and 409A to couple the device with vertical member 490 of the rack. Opening 406A may comprise a threaded opening, for instance, to allow an extension of the front of a device or a slide to couple with device attachment member 400 via a threaded member. Such an arrangement may be particularly advantageous in installations wherein the device is coupled with device attachment member via a slide to facilitate pulling the device out of the rack while the device remains mounted in the rack. In further embodiments, opening 406A may be non-threaded to provide for other attachment features.

Opening 407A may comprise an opening, threaded in some embodiments, to couple vertical member 490 to device attachment member 400 via a threaded member such as securing bolt 480 when pins 460 are used to couple device attachment member 400 with vertical member 490 or to secure device attachment member 400 with vertical member 490 with a bolt or screw when a bolt may be used to secure device attachment member 400 with vertical member 490 via opening 409A and/or 408A. In many embodiments wherein openings of vertical member 490 comprise round or square openings, a bolt may be inserted through opening 407A to couple device attachment member 400 with vertical member 490.

It will be apparent to those skilled in the art having the benefit of this disclosure that the present invention contemplates improved mounting hardware for a rack by incorporating features to adapt to attachment features of the rack, freeing the consumer of a device like a server from the burden of selecting servers and/or racks based upon specific dimensions of a server and attachment features of the racks. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. An apparatus, comprising:
    a device attachment member to couple a device with a server rack;
    a slide attachment member slidably coupled with the device attachment member to slide along an axis of the device attachment member; and
    a rack attachment coupled with the slide attachment member and including a traveling nut to fasten the rack attachment with an attachment feature of the server rack via a threaded member to couple the device with the attachment feature.

2. The apparatus of claim 1, wherein the device attachment member comprises a bent portion having an opening to couple with the attachment feature, wherein the attachment feature comprises a member having a threaded opening.

3. The apparatus of claim 1, wherein the slide attachment member couples with the device attachment member via a spring.

4. The apparatus of claim 1, wherein the slide attachment member comprises a lever portion to couple the rack attachment with the attachment feature.

5. The apparatus of claim 4, wherein the lever portion comprises a curved face to pull the slide attachment member and the rack attachment to a trigger position of the slide attachment member, to load a spring coupling the slide attachment member with the device attachment member.

6. The apparatus of claim 5, wherein the slide attachment member comprises a button portion to hold the slide attachment member in the trigger position, wherein the button portion comprises an extension to insert into a trigger opening of the device attachment member at the trigger position.

7. The apparatus of claim 6, wherein the button portion is movably attached to the slide attachment member to remove the extension from the trigger opening of the device attachment member in response to pressure applied to the button portion.

8. The apparatus of claim 1, wherein the rack attachment comprises a pin to facilitate tool-less attachment of the rack attachment with the attachment feature.

9. The apparatus of claim 1, wherein the rack attachment comprises a pin having a cylindrical portion to couple with the attachment feature, wherein the attachment feature comprises a member having a round opening.

10. The apparatus of claim 9, wherein the pin comprises a second portion having a larger cross-sectional area than the cylindrical portion, coupled between the cylindrical portion and a lip of the rack attachment, to couple with the attachment feature, wherein the attachment feature comprises a member having a rectangular opening.

11. An apparatus, comprising:
a device attachment member having a bent portion with an opening to attach the device attachment member to an attachment feature of a rack via a threaded member;
a slide attachment member slidably coupled with the device attachment member; and
a rack attachment including a non-threaded member to couple the slide attachment member with the attachment feature to mount a device to the rack, wherein the attachment feature comprises a member having a non-threaded opening;
wherein the non-threaded member comprises a pin having a first portion to couple the rack attachment with the attachment feature, wherein the attachment feature comprises a member having a round opening, and a second portion to couple the rack attachment with the attachment feature, wherein the attachment feature comprises a member having a square opening, the smaller portion of the first and second portions coupled with the rack attachment to enter the attachment feature before the larger portion of the first and second portions.

12. The apparatus of claim 11, the device attachment member comprises a slide to couple with the device to facilitate removing the device at least partially from the rack while the device is mounted in the rack.

13. The apparatus of claim 11, wherein the rack attachment comprises a member having a traveling nut to fasten the attachment member to the attachment feature.

14. A system, comprising:
a server to mount in a rack;
a device attachment member to couple with the server;
a slide attachment member coupled with the device attachment member to slide horizontally along the device attachment member;
a rack attachment coupled with the slide attachment member to couple the device attachment member with a vertical member of the rack, wherein the rack attachment adapts to accommodate an attachment feature of the vertical member; and
wherein the slide attachment member couples with the device attachment member via a spring, wherein the spring is to facilitate insertion of a pin through the attachment feature and further wherein the slide attachment member comprises a button to release the slide attachment member to slide toward the vertical member in response to decompression of the spring.

15. The system of claim 14, wherein the device attachment member comprises a slide to couple with the server, the slide coupling with the device attachment member to facilitate horizontal motion of the server after the server is mounted in the rack.

16. The system of claim 14, wherein the pin comprises a first portion coupled with the rack attachment to enter the attachment feature first and a second portion to enter the attachment feature second, wherein the second portion is to couple the rack attachment via a square opening of the attachment feature.

17. The system of claim 14, wherein the device attachment member comprises a bent portion having an opening aligned with the pin, wherein the opening of the bent portion facilitates attachment of the device attachment member to the vertical member.

18. The system of claim 14, wherein the device attachment member comprises a traveling nut to accommodate a gap between the rack attachment member and the vertical member to couple the vertical member with the rack attachment.

* * * * *